US010573731B2

(12) United States Patent
Yip et al.

(10) Patent No.: US 10,573,731 B2
(45) Date of Patent: Feb. 25, 2020

(54) SEMICONDUCTOR TRANSISTOR AND METHOD FOR FORMING THE SEMICONDUCTOR TRANSISTOR

(71) Applicant: Infineon Technologies Austria AG, Villach (AT)

(72) Inventors: Li Juin Yip, Villach (AT); Cesar Augusto Braz, Villach (AT); Olivier Guillemant, Villach (AT); David Laforet, Villach (AT); Cedric Ouvrard, Villach (AT)

(73) Assignee: Infineon Technologies Austria AG, Villach (AT)

( * ) Notice: Subject to any disclaimer, the term of this patent is extended or adjusted under 35 U.S.C. 154(b) by 245 days.

(21) Appl. No.: 15/458,173

(22) Filed: Mar. 14, 2017

(65) Prior Publication Data

US 2017/0271491 A1    Sep. 21, 2017

(30) Foreign Application Priority Data

Mar. 15, 2016   (DE) .................. 10 2016 104 757

(51) Int. Cl.
| | |
|---|---|
| *H01L 29/739* | (2006.01) |
| *H01L 29/06* | (2006.01) |
| *H01L 29/40* | (2006.01) |
| *H01L 29/423* | (2006.01) |
| *H01L 21/306* | (2006.01) |
| *H01L 23/535* | (2006.01) |
| *H01L 29/66* | (2006.01) |

(52) U.S. Cl.
CPC .... *H01L 29/7397* (2013.01); *H01L 21/30604* (2013.01); *H01L 23/535* (2013.01); *H01L 29/0696* (2013.01); *H01L 29/407* (2013.01); *H01L 29/4236* (2013.01); *H01L 29/4238* (2013.01); *H01L 29/66348* (2013.01)

(58) Field of Classification Search
CPC .................................................. H01L 29/7397
See application file for complete search history.

(56) References Cited

U.S. PATENT DOCUMENTS

| | | | |
|---|---|---|---|
| 2002/0175351 A1 | 11/2002 | Baliga et al. | |
| 2009/0166720 A1* | 7/2009 | Zundel | .................. H01L 29/402 257/328 |
| 2012/0241761 A1 | 9/2012 | Asahara | |

FOREIGN PATENT DOCUMENTS

| | | |
|---|---|---|
| EP | 1291907 A2 | 3/2003 |
| KR | 20160026794 A | 3/2016 |

* cited by examiner

*Primary Examiner* — Yu-Hsi D Sun
(74) *Attorney, Agent, or Firm* — Murphy, Bilak & Homiller, PLLC (57) ABSTRACT

A vertical semiconductor field-effect transistor includes a semiconductor body having a front side, and a field electrode trench extending from the front side into the semiconductor body. The field electrode trench includes a field electrode and a field dielectric arranged between the field electrode and the semiconductor body. The vertical semiconductor field-effect transistor further includes a gate electrode trench arranged next to the field electrode trench, extending from the front side into the semiconductor body, and having two electrodes which are separated from each other and the semiconductor body. A front side metallization is arranged on the front side and in contact with the field electrode and at most one of the two electrodes.

15 Claims, 5 Drawing Sheets

SEMICONDUCTOR TRANSISTOR AND METHOD FOR FORMING THE SEMICONDUCTOR TRANSISTOR

TECHNICAL FIELD

Embodiments of the present invention relate to semiconductor transistors, in particular to vertical field-effect semiconductor transistors, and to methods for manufacturing semiconductor transistors.

BACKGROUND

Semiconductor devices, in particular field-effect controlled switching devices or components such as a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems.

In such components, a load path between a first main electrode (also referred to as first load electrode, e.g., a source or emitter) and a second main electrode (also referred to as second load electrode, e.g., a drain or collector that are arranged opposite to each other in vertical devices) can be switched "ON" (i.e., the conductive state) or "OFF" (i.e., the blocking state) using an appropriate control signal applied to a control input (gate). In the conductive state, the load path has a low on-state resistance $R_{ON}$ (between drain and source for a MOSFET, $R_{DS(ON)}$). Typically, each new generation of controllable semiconductor components are desired to have a lower area specific on-resistance $R_{ON}*A$ than the previous generation without deterioration of the switching characteristics. Thereby, on the one hand, the static power dissipation can be reduced, and on the other hand, higher current densities can be obtained.

For optimizing device operation, further figures-of-merit (FOM) may have to be taken into account. One important parameter is FOMoss (Figure-of-Merit (output)), i.e. the product of the on-state resistance $R_{ON}$ and the output charge Qoss (stored charges in a space charge region formed in the OFF-state. As such, FOMoss weights conduction losses ($R_{ON}$) and switching losses (Qoss). A further measure for the overall performance and the costs for the gate-driver, respectively, of a component is $FOM_G$ (Figure-of-Merit (Gate)), i.e., the product of the on-state resistance $R_{ON}$ (between drain and source for a MOSFET) and the gate charge $Q_G$.

For example, even for applications whose switching frequency ($f_{sw}$) does not exceed 100 kHz, a high gate charge $Q_G$ (due to the use of paralleled low $R_{SD(ON)}$-MOSFET-cells) puts a lot of strain on the driver IC, as it dissipates most of these losses, which amount to $Q_G*V_G*f_{sw}$, where $V_G$ is the gate driving voltage. Because of power density requirements, layout challenges and/or timing issues, using more driver ICs is not often an option, whereas using better packages is costly and further requires additional cooling help from a printed circuit board (PCB). Note that handling the heat dissipation becomes harder with increasing $f_{sw}$, since losses increase proportionally with $f_{sw}$. This is e.g. particularly important for converters and rectifiers used in telecommunication.

Depending on application, low $FOM_G$ and/or low FOMoss are often desired to ensure a high overall performance of the component. However, so far used measures to reduce FOMoss and in particular $FOM_G$ tend to have side-effects on other device parameters.

For example, the gate charge $Q_G$ of stand-alone gate trench structures (i.e. gate and field plate in different structure) may be reduced by increasing the gate oxide thickness. However, this tends to decrease the MOSFET performance, e.g. by enhancing increased DIBL (Drain Induced Barrier lowering).

In another example, a thick trench bottom oxide may be used. Although this lowers $Q_G$ (in particular the gate-drain charge $Q_{GD}$), cost and complexity of the MOSFET are increased.

For these and other reasons there is a need for the present invention.

SUMMARY

According to an embodiment of a semiconductor field-effect transistor, the semiconductor field-effect transistor includes: a semiconductor body having a front side, a field electrode trench extending from the front side into the semiconductor body, and a gate electrode trench arranged next to the field electrode trench, extending from the front side into the semiconductor body, and including two electrodes which are separated from each other and the semiconductor body. The field electrode trench includes a field electrode and a field dielectric arranged between the field electrode and the semiconductor body. A front side metallization is arranged on the front side and in contact with the field electrode and at most one of the two electrodes.

According to an embodiment of a semiconductor transistor, the semiconductor transistor includes: a semiconductor body having a front side, a first electrode pair including a first electrode and a second electrode which extend from the front side into the semiconductor body and are separated from each other and the semiconductor body by a contiguous dielectric structure, and a first field electrode which extends into the semiconductor body, is separated from the semiconductor body by a field dielectric, and has in a vertical direction perpendicular to the front side a larger extension than each of the first electrode and the second electrode.

According to an embodiment of a method for forming a semiconductor transistor, the method includes: providing a semiconductor wafer having a front side, forming from the front side a gate electrode trench and a field electrode trench so that the field electrode trench extends deeper into the semiconductor wafer than the gate electrode trench, forming two electrodes in the gate electrode trench, so that the two electrodes are separated from each other and the semiconductor wafer, and forming a field dielectric and a field electrode in the field electrode trench so that the field dielectric separates the field electrode from the semiconductor wafer.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis being placed upon illustrating the principles of the invention. Moreover, in the Figures, like reference numerals designate corresponding parts. In the drawings:

FIG. 3A to FIG. 4D illustrate method steps of a method for manufacturing a semiconductor transistor according to embodiments.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a main side or a main surface of a semiconductor substrate or body. This can be for instance the upper or front side (surface) but also a lower or backside side (surface) of a wafer or a die.

The term "vertical" as used in this specification intends to describe an orientation which is substantially arranged perpendicular to the main side, i.e. parallel to the normal direction of the main side of the semiconductor substrate or body.

The terms "above" and "below" as used in this specification intends to describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n⁻" means a doping concentration which is less than the doping concentration of an "n"-doping region while an "n⁺"-doping region has a larger doping concentration than the "n"-doping region. However, indicating the relative doping concentration does not mean that doping regions of the same relative doping concentration have to have the same absolute doping concentration unless otherwise stated. For example, two different n⁺-doping regions can have different absolute doping concentrations. The same applies, for example, to an doping and a p⁺-doping region.

Specific embodiments described in this specification pertain to, without being limited thereto, to semiconductor transistors, in particular to vertical semiconductor transistors such as vertical n-channel or p-channel MOSFETs or IGBTs, in particular to vertical power MOSFETs, and to manufacturing methods therefor.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs (field-effect transistors) having a gate insulator that is not an oxide, i.e. the term MOSFET is used in the more general term meaning of IGFET (insulated-gate field-effect transistor) and MISFET (metal-insulator-semiconductor field-effect transistor), respectively.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

Typically, the gate electrode is implemented as trench-gate electrode, i.e. as a gate electrode which is arranged in a trench extending from the main side or surface into the semiconductor substrate or body.

In the context of the present specification, the term "field-plate" intends to describe an conductive region which is arranged next to a semiconductor region, for example the drift region or a part thereof, and/or next to a pn-junction formed in the semiconductor region, insulated from the semiconductor region, and made of a material of sufficient electric conductivity such as highly doped poly-silicon, a silicide, a metal or the like to form an equipotential region, i.e. a region in which a variation of the electric potential is at least one order of magnitude lower, more typically at least two orders of magnitude lower compared to a voltage drop in the adjacent semiconductor region(s) in an operating mode of the semiconductor device. The "field-plate" may be configured to expand a depleted portion in the semiconductor region by charging to an appropriate voltage, typically a negative voltage with regard to an adjacent semiconductor region for an n-type semiconductor region.

In the context of the present specification, the term "field electrode" intends to describe a field-plate which at least partly arranged in a semiconductor substrate or body, typically in a trench which e.g. extends from a main side or surface into the semiconductor substrate or body.

Typically, the semiconductor device is a vertical power field-effect transistor having an active area with a plurality of FET-cells (field-effect-transistor-cells such as MOSFET-cells for controlling a load current between two power metallization arranged opposite, e.g. between a front side metallization and a backside metallization. Furthermore, the vertical power field-effect transistor has typically a peripheral area with at least one edge-termination structure at least partially surrounding an active area of FET-cells when seen from above.

In the context of the present specification, the term "metallization" intends to describe a region or a layer with metallic or near metallic properties with respect to electric conductivity. Accordingly, a metallization may form an equipotential region during device operation. A metallization may be in contact with a semiconductor region to form a lead, a pad and/or a terminal of the semiconductor device. The metallization may be made of and/or comprise a metal such as Al, Ti, W, Cu, and Mo, or a metal alloy such as NiAl. The metallization may also include different electrically conductive materials, for example a stack of those metals and/or alloys.

In the context of the present specification, the terms "in ohmic contact", in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously.

The term "power semiconductor device" as used in this specification intends to describe a semiconductor device on a single chip with high voltage and/or high current switching capabilities. In other words, power semiconductor devices are intended for high current, typically in the Ampere range and/or high voltages, typically above about 30° V, more typically above about 100 V, even more typically above about 400 V or even above about 600 V.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e. g. at the edge and/or backside of the semiconductor device. The edge-termination structure may, for example, lower the field intensity around a termination region of a rectifying junction by spreading the electric field lines across the termination region. Examples of edge-termination structures include one or more field-plates and one or more floating guard rings.

In the following, embodiments pertaining to semiconductor devices and manufacturing methods for forming semiconductor devices are explained mainly with reference to silicon (Si) semiconductor devices having a monocrystalline Si semiconductor body. Accordingly, a semiconductor region or layer is typically a monocrystalline Si-region or Si-layer if not stated otherwise.

It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

Figure 1A:
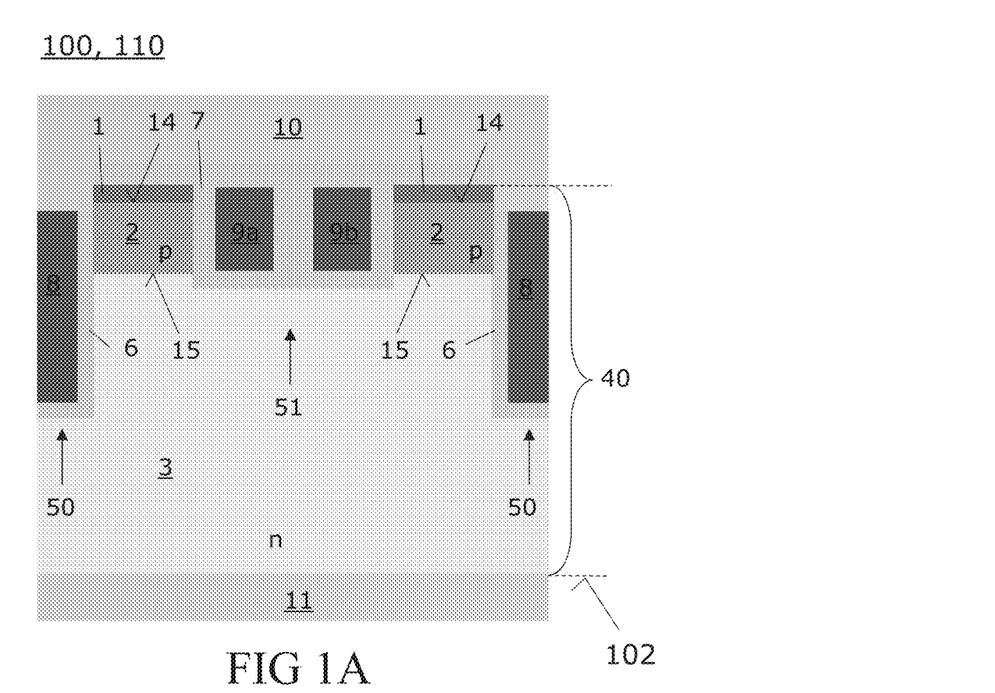
FIG. 1A illustrates a vertical section of a vertical semiconductor transistor according to an embodiment.

FIG. 1A illustrates a section 110 of a vertical cross-section through a vertical semiconductor transistor 100. The semiconductor transistor 100 has a semiconductor body 40 extending between a front side 101 and a backside 102 arranged opposite to the front side 101.

The front side 101 and the backside 102 are typically arranged in horizontal planes. Further, the front side 101 and the backside 102 may form substantially flat surfaces of the semiconductor body 40.

In horizontal directions, the semiconductor body 40 is delimited by (extends to) a lateral edge (not shown in FIG. 1A) surrounding the semiconductor body 40.

The horizontal extension(s) of the semiconductor body 40 and the semiconductor device 100, respectively, may be up to several millimeters (mm) or even larger than a centimeter (cm). However, FIG. 1A typically only correspond to a small section of an active area of the semiconductor device 100, more typically to one of a plurality of cells, for example to a unit cell of the active area.

The vertical extension of the semiconductor body 40 typically depends on the type and the voltage class of the semiconductor device 100, i.e. the desired voltage blocking ($V_{BR}$) capability, and is typically below a few 100 microns (μm).

For example, the vertical extension of the semiconductor body of a 600V vertical IGBT or MOSFET and a 1200V vertical IGBT or MOSFET may be about 70 μm and about 110 μm to about 140 μm, respectively. The vertical extension of the semiconductor body is typically at least one order of magnitude lower, more typically at least two orders of magnitude lower than the horizontal extension(s).

In the exemplary embodiment illustrated in FIG. 1A, two field electrode trenches 50 extends from the front side 101 into the semiconductor body 40. Typically, the two field electrode trenches 50 are also separated from each other when seen from above.

In each of the field electrode trenches 50, a field electrode 8 is arranged. Further, a field dielectric 6, in the following also referred to as field dielectric region, is arranged in each of the field electrode trenches 50 and between the respective field electrode 8 and the semiconductor body 40.

Accordingly, the respective field electrode 8 is separated from the semiconductor body 40 by the field dielectric 6. Due to the chosen section, typically corresponding to one of a plurality of units or cells, a left side wall portion of the field dielectric 6 in the left field electrode trench 50 and a right side wall portion of the field dielectric 6 in the right field electrode trench 50 are not shown in FIG. 1A.

In the exemplary embodiment illustrated in FIG. 1A, the semiconductor body 40 has two pn-junctions 14, 15. The first pn-junction 14 is formed between an n-type first semiconductor region 1 extending to the front side 101 and an adjoining p-type second semiconductor region 2. The second pn-junction 15 is formed between the second semiconductor region 2 and an adjoining n-type third semiconductor region 3. However, the doping relations may also be reversed.

The field electrode trenches 50 may extend from the front side 101 through the first and second semiconductor regions 1, 2 and partially into the third semiconductor region 3, i.e. below the second pn-junction 15.

A front side metallization 10 is arranged on the front side 101 and in ohmic contact with the field electrodes 8 and at least the first semiconductor region 1, typically forming a source region. Accordingly, the front side metallization 10 typically forms a source metallization.

Further, the front side metallization 10 may be in in ohmic contact with the second semiconductor region 2, typically forming a body region.

Even further, the second semiconductor region 2 may be in contact with the front side metallization 10 via a higher p-doped body contact region (not shown in FIG. 1A) arranged therebetween.

As illustrated in FIG. 1A, the front side metallization 10 may extend partly into the field electrode trenches 50.

Further, the sidewall portions of the field dielectric 6 may not extend to the front side 101.

However, the field dielectric 6 separates the field electrodes 8 from the third semiconductor region 3 and at least an adjoining portion of the second semiconductor region 2.

An upper portion of the third semiconductor region 3 may form a drift region of the semiconductor transistor 100.

A lowermost layer of the third semiconductor region 3 adjoining and forming, respectively, the backside 102 may be highly n-doped to from a drain contact layer in Ohmic contact with a backside metallization 11 arranged on the backside 102 and typically forming a drain metallization.

In the exemplary embodiment illustrated in FIG. 1A, a gate electrode trench 51, in the following also referred to as gate trench, is formed between the two shown field electrode trenches 50.

The gate electrode trench 51 may, in the vertical cross-section, be at least substantially centered in horizontal direction with respect to the field electrode trenches 50.

The gate electrode trench 51 extends from the front side 101 into the semiconductor body 40 and also below the second pn-junction 15, but not as deep as the field electrode trenches 50, for example at most only half as deep.

Due to the gate electrode trench 51, each of the first semiconductor region 1, the second semiconductor region 2, the first pn-junctions 14 formed therebetween, and the second pn-junction 15 formed between the second semiconductor region 2 and the third semiconductor region 3 are, in the shown vertical cross-section, split into two respective portions which are, however, typically contiguous, e.g. substantially ring-shaped (i.e. bounded by an inner closed curve and an outer closed curve surrounding the inner closed curve) when seen from above.

According to an embodiment, two electrodes 9a, 9b (a first electrode 9a and a second electrode 9b) which are separated from each other and the semiconductor body 40 are arranged in the gate electrode trench 51, typically by a contiguous dielectric structure 7 made of one or several dielectric materials such silicon oxide, silicon nitride or silicon oxy-nitride. This trench structure 7, 9a, 9b is in the following also referred to as split gate structure.

The field electrode(s) 8 and the electrodes 9a, 9b may e.g. be formed by doped poly-silicon (Poly-Si) or the like.

At least one of the two electrodes 9a, 9b is in Ohmic contact with a gate metallization (not shown in FIG. 1A) typically arranged on the front side 101, and separated (and insulated) from the first metallization 10 and the semiconductor body 40. An electrode 9a, 9b that is arranged in the gate trench 51 and in Ohmic contact with the gate metallization is in the following also referred to as gate electrode.

Next to the gate electrodes 9a, 9b, a channel region may be formed in the body region 2 along the adjoining sidewall portion(s) of the dielectric structure 7 by appropriately biasing the gate metallization with respect to the first metallization 10.

Accordingly, the vertical transistor 100 may be operated as a MOSFET.

The vertical transistor 100 is typically a power transistor with a plurality of MOSFET-cells 110.

Figure 1B:
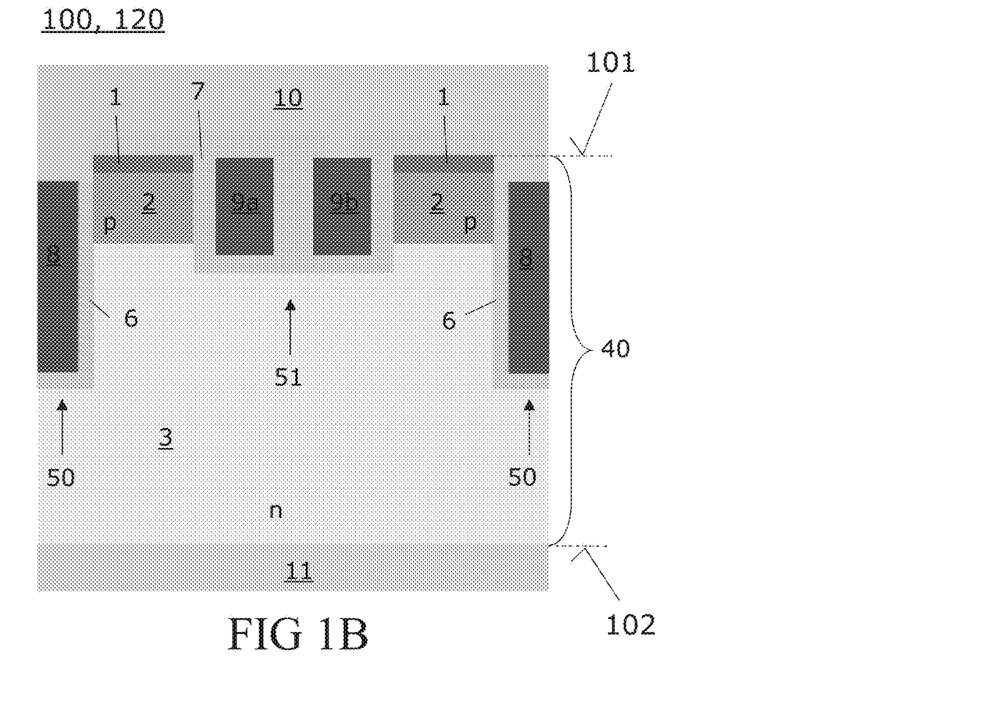
FIG. 1B illustrates another vertical section of the vertical semiconductor transistor illustrated in FIG. 1A according to an embodiment.

According to an embodiment, one of the electrodes 9a, 9b is in Ohmic contact with the first metallization 10. This is illustrated in FIG. 1B showing another vertically orientated section of the vertical semiconductor transistor 100. The shown MOSFET-cell 120 has one gate electrode 9a, and an electrode 9b connected with the first metallization 10.

Accordingly, the gate charge $Q_G$ of the MOSFET-cell 120 (and therefore the strain on a driver IC) is significantly reduced compared to the MOSFET-cell 110. The gate-source charge $Q_{GS}$ as well as gate-drain charge $Q_{GD}$, which is in many applications more important for the switching losses, is reduced by about a factor of two.

The on-state resistance $R_{ON}$ of the MOSFET-cell 120 may be increased. However, it turns out that the influence on $R_{ON}*A$ lowers with increasing voltage class.

Therefore, a better compromise between $R_{ON}*A$ and $Q_G$ is typically achieved for MOSFETs having breakdown voltages $V_{BR}$ of at least 200 V, in particular at least 250 V or 400 V.

The lateral (horizontal) dimension of the split gate structure 7, 9a, 9B and the gate trench 51, respectively, may also depend on voltage class. For example, a horizontal extension of the gate trench 51 between two adjacent mesas 1, 2 of 250 V—MOSFET 100 may be in a range from about 700 nm to 900 nm, e.g. about 800 nm.

Figure 2A:
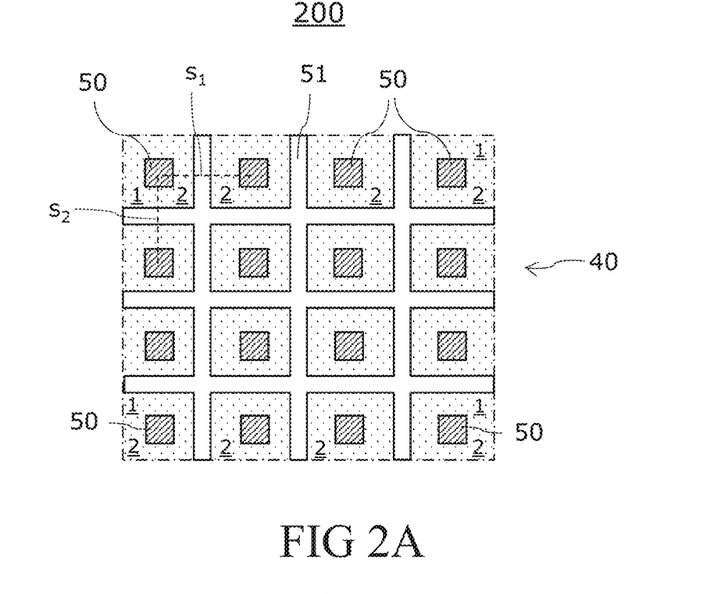
FIG. 2A illustrates a layout corresponding to a section of the top view of a vertical semiconductor transistor according to an embodiment.
Figure 2B:
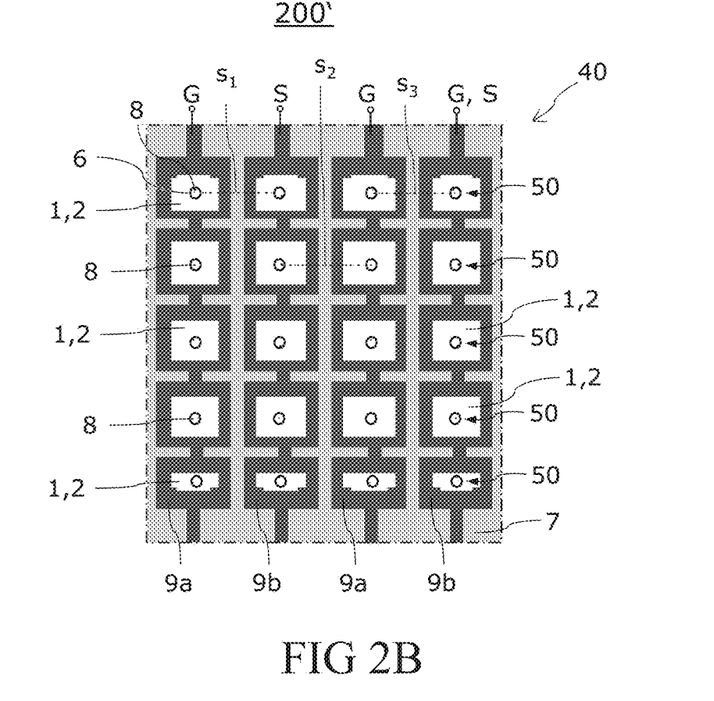
FIG. 2B illustrates a layout corresponding to a section of the top view of a vertical semiconductor transistor according to an embodiment.

Further, a particularly good $R_{on}*A$ performance and $FOM_{oss}$ performance in combination with low $Q_G$ as intended in many applications (e.g. for a primary side switch of solar micro-inverters) can be achieved when a needle-like design as explained below with regard to FIG. 2A and FIG. 2B is used for the field electrodes 8.

Moreover, $Q_G$ can be easily tuned by varying the number of MOSFET-cell 120 in a basic design with MOSFET-cells 110, 120, for example using different metal layouts. This means that the same cell design can be used to cover both FOMoss driven applications and FOMg driven applications.

FIG. 2A illustrates a layout of field electrode trenches 50 and a gate electrode trench 51 of a vertical semiconductor transistor 200 which is similar to the semiconductor transistor 100 explained above with regard to FIG. 1A and FIG. 1B. The semiconductor transistor 200 may also be implemented as a MOSFET.

FIG. 2A may correspond to a section of an active area of the semiconductor transistor 200 in a plane view and a corresponding section of a horizontal cross-section through the semiconductor body 40, respectively. A vertical section through the semiconductor body 40 along lines $s_1$, $s_2$ may, depending on layout, correspond to the sections 110, 120 shown in FIG. 1A and FIG. 1B, respectively.

In the exemplary embodiment, a gate trench 51 is formed such the gate trench 51 surrounds a plurality of mesa regions of the semiconductor body 40 as indicted by the reference numerals 1, 2 referring to the first and second semiconductor regions. Note that portions of third semiconductor region adjoining a respective second semiconductor region typically also form a part of the respective mesa region 1, 2. For sake of clarity, the electrodes (9a, 9b) and the dielectric structure (7) arranged in the gate trench 51 is not shown in FIG. 2A.

In the exemplary embodiment illustrated in FIG. 2A, the gate trench 51 is contiguous. However, this is typically not the case for the first electrode (9a) and the second electrode (9b) arranged therein.

As illustrated in FIG. 2A, the mesa regions 1, 2 may be arranged in a checkerboard like manner.

In each of the mesa regions 1, 2 a field electrode trench 50 may be arranged. Accordingly, the mesa regions 1, 2 are substantially ring-shaped.

In other embodiments (not shown in FIG. 2A), a plurality of parallel gate trenches which are strip-shaped when seen from above may be used. In these embodiments, the mesa regions may also be substantially strip-shaped when seen from above. Further, a plurality of field electrode trenches 50 may be formed in each of the strip-shaped mesa regions.

Further, the gate electrode trench(es) 51 and the field electrode trenches 50 extend in a direction from the front side of the semiconductor body towards the backside of the semiconductor body. The trenches 50, 51 may have substantially vertical sidewalls but may also be tapered.

As illustrated in FIG. 2A, each of the field electrode trenches 50 may be surrounded by the gate electrode trench 51 when seen from above.

Further, the field electrode trenches 50 may be substantially centered within the respective mesa region 1, 2.

Typically, each of the field electrode trenches 50 (as well as the field electrodes) has, in a horizontal cross-section parallel to the front side and when seen from above, respectively, a first area, and in a respective vertical cross-section perpendicular to the front side a second area which is larger than the first area, more typically by a factor of at least 5, of at least 10, or even of at least 25.

The field electrode trenches 50 and the field electrodes, respectively, may be needle-shaped or substantially needle-shaped.

Accordingly, the semiconductor transistor 200 may have a low gate charge $Q_G$ and, due to the field electrode design and arrangement, both excellent Ron*A—and FOMoss—performances. This makes the semiconductor transistor 200 particularly interesting for many applications, e.g. as a primary side switch of a solar micro-inverter, FIG. 2B illustrates a semiconductor transistor 200' having in an active area an array of needle-shaped field electrodes trenches 50 each of which is locally arranged in a mesa region 1, 2 formed between the gate trench and respective portions thereof, respectively.

The semiconductor transistor 200' is similar to the semiconductor transistors 100, 200 explained above with regard to FIG. 1A to FIG. 2A and may also be implemented as a MOSFET.

FIG. 2B may correspond to a section of an active area of the semiconductor transistor 200 in a plane view and a corresponding section of a horizontal cross-section through the semiconductor body 40, respectively. The gate electrode trench may correspond to the combined areas of the shown electrodes 9a, 9b and the dielectric structure 7. Vertical sections through the semiconductor body 40 along lines $s_1$, $s_2$ may correspond to the section 110 shown in FIG. 1A and a mirrored version the section 110 shown in FIG. 1A, respectively.

Each field electrode trench 50 has a needle-shaped field electrode 8 with circular cross-section. Further, an electrically insulating layer 6 is formed in each of the field electrode trenches 50 between the corresponding field electrode 8 and an inner surface of the trench 50.

In an upper area, i.e. closer to the front side, the field electrode trenches 50 have typically no electrically insulating layer 6, to allow, on the one hand, electric contact with the source region 1 via side wall contacting, and, on the other hand, to allow electric contact with the body region 2, typically via a heavily doped p+-region.

In the exemplary embodiment illustrated in FIG. 2B, four columns of five mesas 1, 2 are shown.

The mesas 1, 2 of each column may be surrounded by a respective common electrode 9a, 9b connected either to the first metallization (source metallization) or a gate metallization as indicted by the references signs S referring to source and G referring to gate.

The connecting pattern may be adapted in accordance with $FOM_{OSS}$, $FOM_G$, and/or $Q_G$—requirements of an intended circuitry by choosing an appropriate layout of the metal layers (source and gate metallization) in the peripheral area surrounding the active area.

Depending on the connecting pattern (FIG. 2B illustrates two exemplary pattern "GSGG" and "GSGG" for the four columns), a vertical section through the semiconductor body 40 along line $s_3$ may correspond to the section 110 shown in FIG. 1A and the section 120 shown in FIG. 1B, respectively.

The electrodes 9a, 9b and the gate electrode 8 may be formed from the same conductive material, for example doped polysilicon, a metal or another conductive material(s) used in semiconductor technique.

In the following, methods for forming the semiconductor devices 100, 200, 200' are explained.

FIG. 3A to FIG. 4D illustrate method steps of a method for manufacturing a semiconductor transistor 100 as explained above with regard to FIG. 1A and FIG. 1B.

In a first process, a semiconductor body 40, typically a semiconductor wafer 40 having a front side 101 is provided. In embodiments referring to the manufacturing of n-channel MOSFETs, the provided semiconductor wafer 40 typically includes a drain layer (not shown in FIG. 3A), e.g. a highly n-doped substrate, extending to a backside 102 and in ohmic with a drift layer 3, e.g. implemented as an n-doped epitaxial layer, arranged on the drain layer, and a body layer 2, e.g. a p-doped epitaxial layer, forming a pn-junction 15 with the drift layer 2, and a source layer 1, e.g. a p-doped epitaxial layer, forming a further pn-junction 14 with the body layer 2 and extending the front side 101.

Figure 3A:
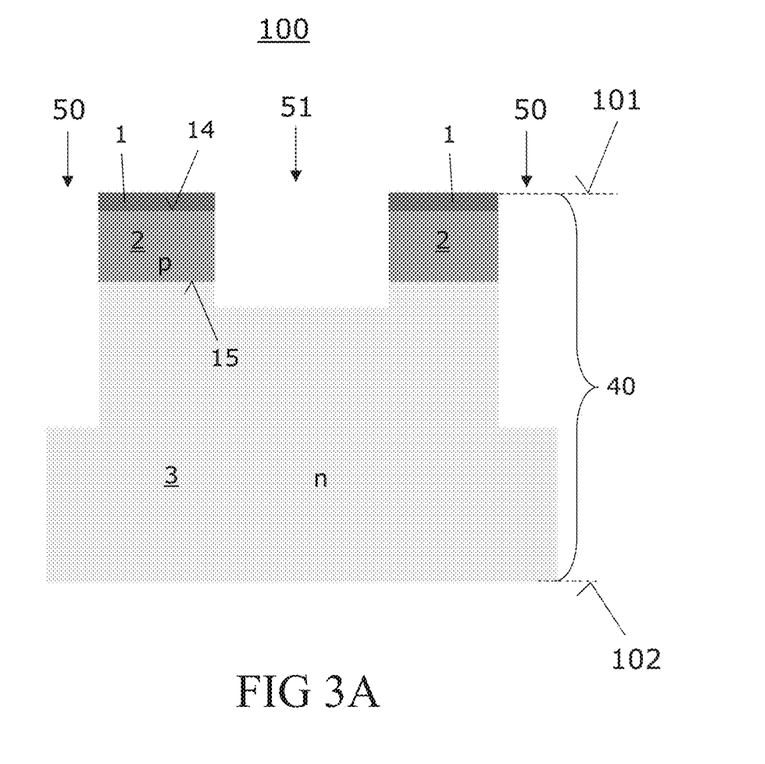

The body layer 2 and the source layer 1 may also be formed by implanting p-type and n-type dopants and subsequent annealing.

FIG. 3A illustrates a vertical section of the wafer 40 after forming from the front side 101 a gate electrode trench 51 and field electrode trenches 50 so that the field electrode trenches 50 extends deeper into the wafer 40 than the gate electrode trench 51.

Forming the gate electrode trench 51 and the field electrode trenches 50 is typically performed such that the gate electrode trench 51 surrounds a plurality of field electrode trenches 50 when seen from above.

Forming the gate electrode trench 51 and field electrode trenches 50 typically includes masked etching.

Figure 3B:
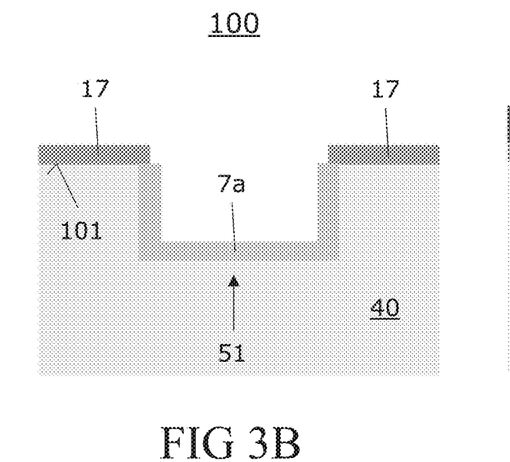

For example, a silicon-nitride hard mask 17 of appropriate thickness may be used for etching the gate electrode trench 51 as illustrated in FIG. 3B showing a smaller section of the wafer 40 after forming a gate dielectric 7a at side and bottom walls of the gate electrode trench 51. This may e.g. be achieved by thermal oxidation for a silicon wafer.

Typically, a field dielectric is formed at walls of the field electrode trenches (50). Forming the field dielectric and the gate dielectric 7a may include one or more common processes.

For sake of clarity, the field electrode trenches (50), the body layer (2) and the source layer (1) are not shown in FIG. 3A and the following figures.

Figure 3C:
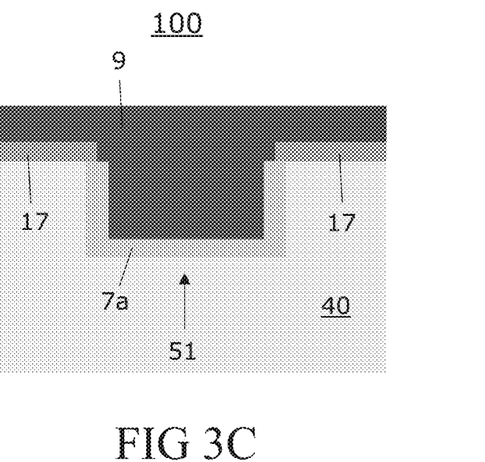

Thereafter, a conductive material 9 such as doped poly-Si may be deposited to fill the remainder of the gate electrode trench 51 (and the field electrode trenches). The resulting structure 100 is shown in FIG. 3C.

Figure 4A:
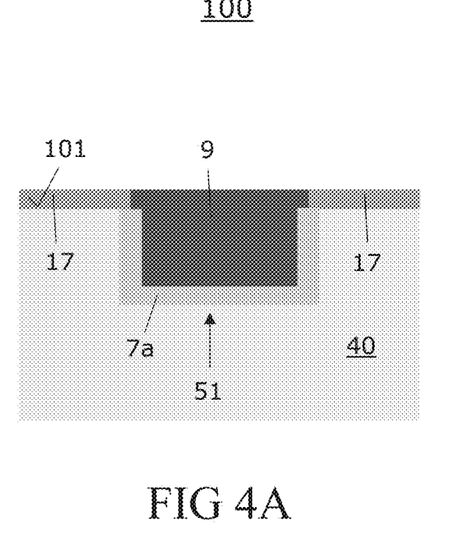

Thereafter, the conductive material 9 may be removed from the front side 101, for example by chemical mechanical polishing (CMP) using the hard mask 17 as a stop region. The resulting structure 100 is shown in FIG. 4A.

Figure 4B:
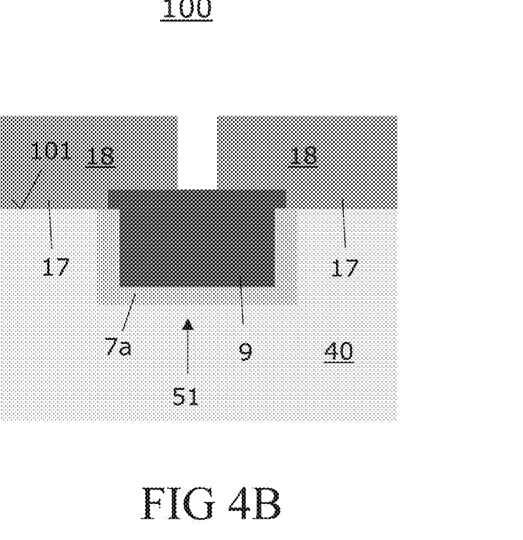

Thereafter, a mask 18 covering the field electrode trenches, typically a resist mask, may be formed on the front side 101.

As illustrated in FIG. 4B, the mask 18 has an opening that is arranged within the conductive material 9 when seen from above, more typically substantially centered with respect to the conductive material 9 in projection onto the front side 101.

Typically, the mask 18 has a plurality of openings when a power transistor is to be manufactured. The openings that may be strip shaped when seen from above.

Figure 4C:
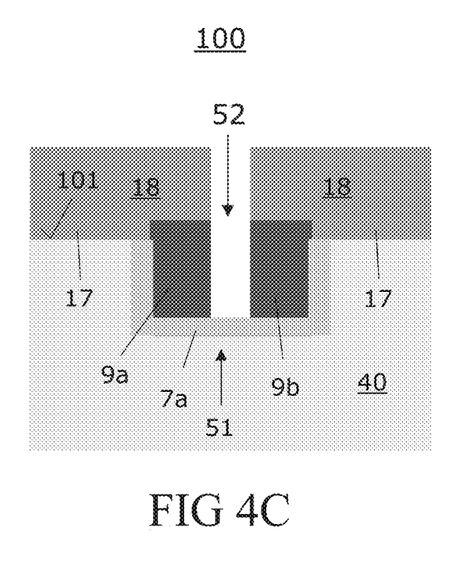

Thereafter, a central portion of the conductive region 9 may be removed by etching using the mask 18. The resulting structure 100 is shown in FIG. 4C.

Accordingly, two electrodes 9a, 9b which are spaced apart from each other by a central trench or gap 52 are formed in the gate electrode trench 50.

Thereafter, the mask 18 may be removed and the central trench 52 may be filled with a dielectric portion 7b. The resulting structure 100 is shown in FIG. 4D.

Forming the dielectric portion 7b between the two electrodes 9a, 9b may be achieved by depositing a TEOS (tetraethyl-orthosilicate) or the like, e.g. by LPCVD (low-pressure chemical vapor deposition), and a further CMP-process. For the latter, the hard mask 17 may again be used as a stop region.

Figure 4D:
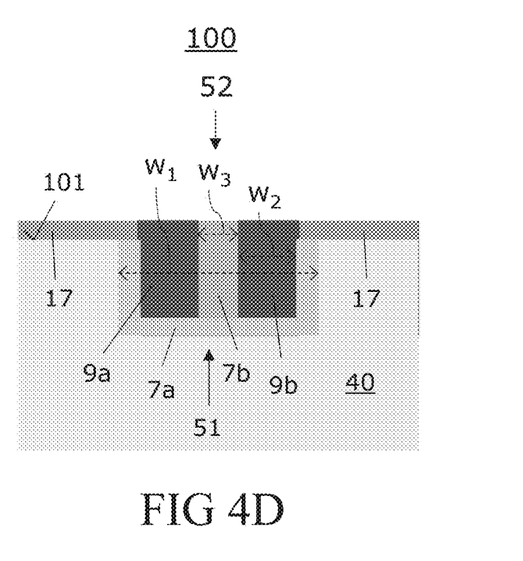

FIG. 4D also illustrates horizontal dimensions $w_1$, $w_2$, $w_3$ that may be chosen in accordance with the voltage class of the semiconductor transistor to be manufactured.

For example, a horizontal width $w_1$ of the gate electrode trench 50 may be in a range from about 700 nm to about 900 nm, e.g. about 800 nm, a horizontal width $w_2$ of the electrodes 9a, 9b may be in a range from about 150 nm to about 250 nm, e.g. about 200 nm, and a horizontal distance $w_3$ between the electrodes 9a, 9b in the gate trench 51 may be in a range from about 200 nm to about 800 nm, e.g. about 250 nm for a 250 V-MOSFET 100.

Thereafter, a further dielectric layer may be deposited on the front side 101.

Thereafter, a front side metallization in Ohmic contact with the field electrode and the electrode 9b may be formed on the front side 101 and a backside metallization in Ohmic contact with the semiconductor wafer 40 may be formed opposite the front side metallization. Accordingly, a structure 100 as illustrated in FIG. 1B may be formed.

Alternatively or in addition (i.e. in another area of the wafer 40), the front side metallization is formed only in Ohmic contact with the field electrode. Accordingly, a structure 100 as illustrated in FIG. 1A may be formed.

Further, a gate metallization may be formed (typically prior to forming the backside metallization) on the front side 101.

Forming the metallizations on the front side 101 and the backside may include depositing an aluminum layer or the like. Further, the metal layer deposited on the front side 101 may be structured to form separated source and gate metallizations.

In a final process, the wafer 40 may be separated (singulated) into individual vertical semiconductor transistors 100, typically by sawing, dicing, or cutting along scribe lines.

FIG. 5A to FIG. 5D illustrate method steps of a further method for manufacturing a semiconductor transistor according to embodiments.

Figure 5A:
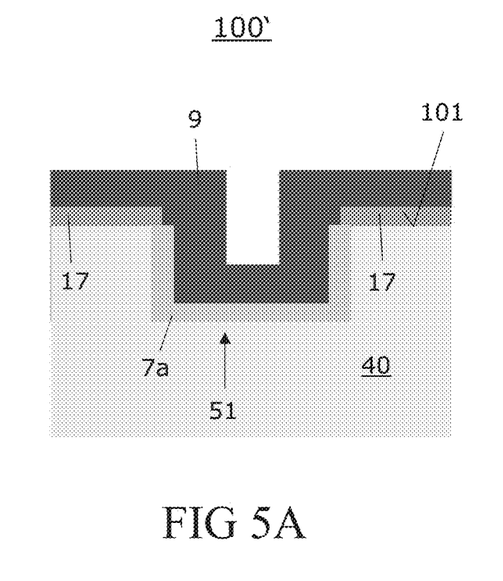
FIG. 5A to FIG. 5D illustrate method steps of a further method for manufacturing a semiconductor transistor according to embodiments.

After processes as explained above with regard to FIG. 3A, 3B, a conformal depositing may be used to partly fill the gate electrode trench 51 with a conductive layer 9. FIG. 5A illustrates a vertical section of the resulting structure 100'.

Figure 5B:
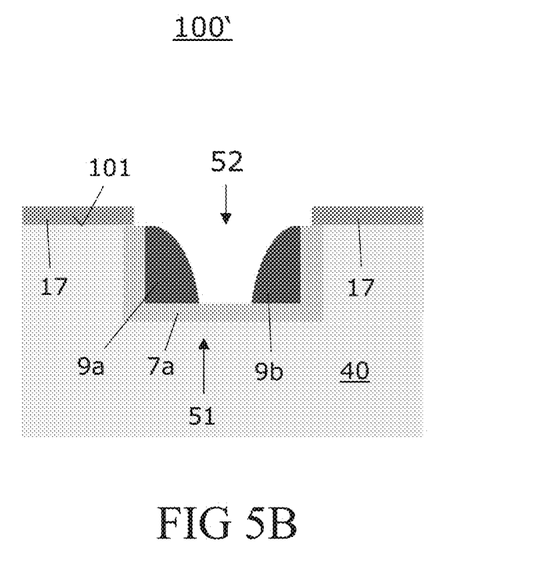

Thereafter, isotropic etching may be used to remove the conductive layer 9 from the front side 101 and to form two separated electrodes 9a, 9b in the gate electrode trench 51. The resulting structure 100' is shown in FIG. 5B.

Thereafter, a dielectric portion 7b may be formed on and between the two electrodes 9a, 9b. This may again be achieved by depositing a TEOS or the like and a subsequent CMP-process. The resulting structure 100' is shown in FIG. 5C.

Figure 5C:
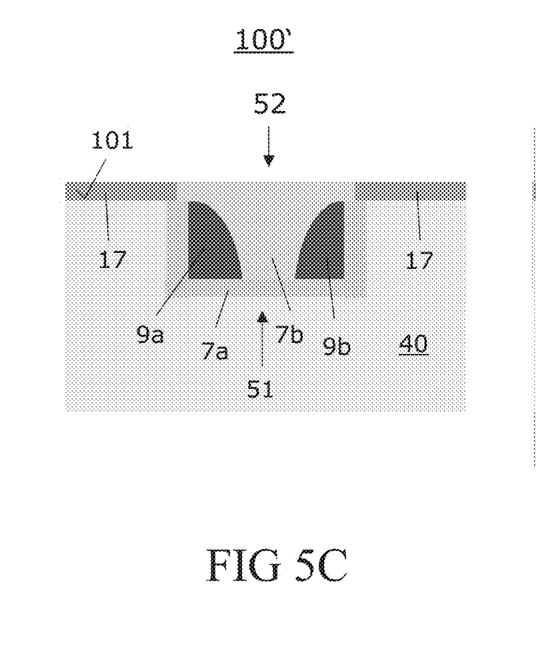

Due to the used process sequence, the electrodes 9a, 9b in the gate electrode trench 51 of FIG. 5C are also covered by the dielectric portion 7b.

Accordingly, the gate and source metallizations may, after forming appropriate contact trenches to the electrodes 9a, 9b, be directly formed on the structure 100' shown in FIG. 5C.

Figure 5D:
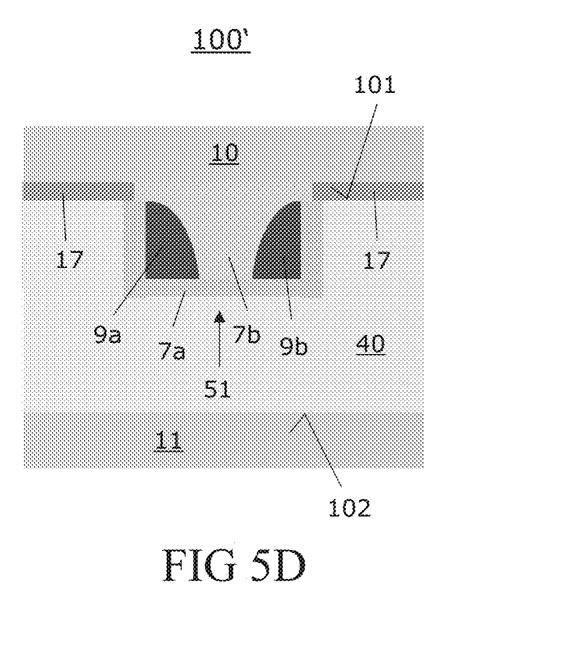

FIG. 5D illustrates the resulting structure 100' after further forming a backside metallization 11 on the back side.

In a final process, the wafer 40 may be separated (singulated) into individual vertical semiconductor transistors 100'.

In one embodiment, the manufactured semiconductor transistor includes a semiconductor body having a front side. A front side metallization is arranged on the front side. The semiconductor transistor further includes a gate metallization separated from the front side metallization. In a vertical cross-section perpendicular to the front side, the semiconductor transistor further includes two field electrode trenches and a gate electrode trench extending from the front side into the semiconductor body. Each of the two field electrode trenches includes a field electrode in contact with the front side metallization, and a field dielectric arranged between the field electrode and the semiconductor body. The gate electrode trench is, in the vertical cross-section, arranged between the two field electrode trenches, and includes a first electrode and a second electrode which are separated from each other and the semiconductor body, also when seen from above. The first electrode is in contact with the gate metallization. The second electrode is in contact with the front side metallization.

The manufactured vertical semiconductor transistor may be used in a driver circuitry.

According to an embodiment, a driver circuitry, for example a bridge circuitry includes a semiconductor field-effect transistor including a semiconductor body having a front side and a load metallization arranged on the front side. A field electrode trench extends from the front side into the semiconductor body and includes a field electrode in Ohmic contact with the load metallization, and a field dielectric arranged between the field electrode and the semiconductor body. A gate electrode trench extending from the front side into the semiconductor body and surrounds the field electrode trench, typically a plurality of field electrode trenches, when seen from above. The gate electrode trench includes two electrodes which are, at least in vertical cross-section perpendicular to the front side, separated from each other and the semiconductor body by a dielectric structure. At most one of the two electrodes is in Ohmic contact with the load metallization.

The semiconductor field-effect transistor is typically a power device and or may form a low-side switch of the driver circuitry.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific FIG. may be combined with features of other Figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor field-effect transistor, comprising:
   a semiconductor body having a front side;
   a field electrode trench extending from the front side into the semiconductor body, the field electrode trench comprising a field electrode and a field dielectric arranged between the field electrode and the semiconductor body;
   a gate electrode trench arranged next to the field electrode trench, extending from the front side into the semiconductor body, and comprising two electrodes which are separated from each other and the semiconductor body; and
   a front side metallization arranged on the front side and in contact with the field electrode and at most one of the two electrodes.

2. The semiconductor field-effect transistor of claim 1, further comprising a gate metallization arranged on the front side and in contact with at least one of the two electrodes.

3. The semiconductor field-effect transistor of claim 1, wherein a vertical extension of the gate electrode trench is, in a direction perpendicular to the front side, lower than a vertical extension of the field electrode trench, wherein the two electrodes are spaced apart from each other when seen from above, and/or wherein one of the two electrodes is, in a direction parallel to the front side, arranged between the other of the two electrodes and the field electrode.

4. The semiconductor field-effect transistor of claim 1, wherein the field electrode trench comprises in a first cross-section parallel to the front side a first area, and wherein the field electrode trench comprises in a second cross-section perpendicular to the front side a second area which is larger than the first area.

5. The semiconductor field-effect transistor of claim 1, wherein the semiconductor body comprises two pn-junctions, wherein the gate electrode trench extends across the two pn-junctions, wherein each of the two pn-junctions extends between the gate electrode trench and the field electrode trench.

6. The semiconductor field-effect transistor of claim 1, wherein the gate electrode trench surrounds the field electrode trench.

7. The semiconductor field-effect transistor of claim 1, further comprising an additional gate electrode trench, wherein the field electrode trench is, in a cross-section perpendicular to the front side, arranged between the gate electrode trench and the additional gate electrode trench.

8. The semiconductor field-effect transistor of claim 1, further comprising an additional field electrode trench, wherein the gate electrode trench is, in a cross-section perpendicular to the front side, arranged between the field electrode trench and the additional field electrode trench.

9. A semiconductor transistor, comprising:
a semiconductor body having a front side;
a first electrode pair comprising a first electrode and a second electrode which extend from the front side into the semiconductor body and are separated from each other and the semiconductor body by a contiguous dielectric structure; and
a first field electrode which extends into the semiconductor body, is separated from the semiconductor body by a field dielectric, and has in a vertical direction perpendicular to the front side a larger extension than each of the first electrode and the second electrode.

10. The semiconductor transistor of claim 9, wherein the first field electrode is surrounded by at least one of the first electrode and the second electrode.

11. The semiconductor transistor of claim 9, further comprising a front side metallization arranged on the front side and in contact with the first field electrode.

12. The semiconductor transistor of claim 11, further comprising a second field electrode, wherein the first electrode pair is, in a vertical cross-section perpendicular to the first side, arranged between the first field electrode and the second field electrode, and wherein the second field electrode is in contact with the front side metallization.

13. The semiconductor transistor of claim 9, further comprising at least one of a backside metallization arranged on a backside of the semiconductor body, and a gate metallization arranged on the front side and in contact with at least one of the first electrode and the second electrode.

14. The semiconductor transistor of claim 9, further comprising a second field electrode and a second electrode pair comprising a first electrode and a second electrode, and wherein the second field electrode is, in a vertical cross-section perpendicular to the first side, arranged between the first electrode pair and the second electrode pair.

15. The semiconductor transistor of claim 14, further comprising a gate metallization arranged on the front side and in contact with at least one of the first electrode and the second electrode of the first electrode pair, wherein at least one of the first electrode and the second electrode of the second electrode pair is in contact with the gate metallization.

* * * * *